US011043364B2

(12) United States Patent
Wu et al.

(10) Patent No.: US 11,043,364 B2
(45) Date of Patent: Jun. 22, 2021

(54) PROCESS KIT FOR MULTI-CATHODE PROCESSING CHAMBER

(71) Applicant: APPLIED MATERIALS, INC., Santa Clara, CA (US)

(72) Inventors: Hanbing Wu, Millbrae, CA (US); Anantha K. Subramani, San Jose, CA (US); Ashish Goel, Bangalore (IN); Deepak Jadhav, Hubli (IN); Rongjun Wang, Dublin, CA (US); Chi Hong Ching, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/614,595

(22) Filed: Jun. 5, 2017

(65) Prior Publication Data
US 2018/0350572 A1   Dec. 6, 2018

(51) Int. Cl.
*H01J 37/34* (2006.01)
*H01J 37/32* (2006.01)
(Continued)

(52) U.S. Cl.
CPC ...... *H01J 37/3441* (2013.01); *C23C 14/3464* (2013.01); *C23C 16/4585* (2013.01);
(Continued)

(58) Field of Classification Search
CPC ............. H01J 37/3441; H01J 37/32477; H01J 37/32623; H01J 37/32651;
(Continued)

(56) References Cited

U.S. PATENT DOCUMENTS 5,658,442 A * 8/1997 Van Gogh et al. ......................... C23C 14/3407
204/192.12
7,670,436 B2 * 3/2010 Miller .................... C23C 14/50
118/728

(Continued)

FOREIGN PATENT DOCUMENTS

CN    101989544 A    3/2011
JP    2013-168690 A   8/2013
(Continued)

OTHER PUBLICATIONS

Search Report and Written Opinion dated Sep. 21, 2018 for PCT Application No. PCT/US2018/036044.
(Continued)

*Primary Examiner* — Michael A Band
(74) *Attorney, Agent, or Firm* — Moser Taboada

(57) ABSTRACT

Embodiments of a process kit for use in a multi-cathode process chamber are disclosed herein. In some embodiments, a process kit includes a rotatable shield having a base, a conical portion extend downward and radially outward from the base, and a collar portion extending radially outward from a bottom of the conical portion; an inner deposition ring having a leg portion, a flat portion extending radially inward from the leg portion, a first recessed portion extending radially inward from the flat portion, and a first lip extending upward from an innermost section of the first recessed portion; and an outer deposition ring having a collar portion, an upper flat portion disposed above and extending radially inward from the collar portion, a second recessed portion extending inward from the upper flat portion, and a second lip extending upward from an innermost section of the second recessed portion.

20 Claims, 3 Drawing Sheets

(51) Int. Cl.
*C23C 14/34* (2006.01)
*C23C 16/458* (2006.01)

(52) U.S. Cl.
CPC .. *H01J 37/32477* (2013.01); *H01J 37/32623* (2013.01); *H01J 37/32642* (2013.01); *H01J 37/32651* (2013.01); *H01J 37/3411* (2013.01); *H01J 37/3488* (2013.01); *C23C 14/3407* (2013.01); *H01J 37/32458* (2013.01); *H01J 37/32743* (2013.01); *H01J 37/3429* (2013.01)

(58) Field of Classification Search
CPC ............... H01J 37/32642; H01J 37/026; H01J 37/3411; H01J 37/3488; C23C 14/3414; C23C 14/564; C23C 14/34; C23C 16/4585
See application file for complete search history.

(56) References Cited

U.S. PATENT DOCUMENTS

| | | | |
|---|---|---|---|
| 8,920,564 B2 * | 12/2014 | Tzu | C23C 16/4412 118/724 |
| 9,062,379 B2 * | 6/2015 | Riker et al. | C23C 14/564 204/298.01 |
| 9,685,309 B2 * | 6/2017 | Makarov | H01J 49/10 |
| 10,227,695 B2 * | 3/2019 | Du Bois | C23C 16/04 |
| 2005/0061447 A1 | 3/2005 | Kim et al. | |
| 2007/0102286 A1 * | 5/2007 | Scheible et al. | C23C 14/3407 204/298.01 |
| 2007/0283884 A1 * | 12/2007 | Tiller et al. | C23C 14/564 118/715 |
| 2014/0262026 A1 * | 9/2014 | Forster | H01J 37/32642 156/345.3 |
| 2015/0279635 A1 | 10/2015 | Subramani et al. | |
| 2015/0303042 A1 | 10/2015 | Shinada et al. | |

FOREIGN PATENT DOCUMENTS

| | | | | |
|---|---|---|---|---|
| KR | 10-2005-0038898 A | | 4/2005 | |
| WO | WO-2012033198 A1 * | | 3/2012 | ......... C23C 14/3464 |

OTHER PUBLICATIONS

Supplementary European Search Report for EP 18812642, dated Jan. 18, 2021.

* cited by examiner

PROCESS KIT FOR MULTI-CATHODE PROCESSING CHAMBER

FIELD

Embodiments of the present disclosure generally relate to process kits for a multi-cathode processing chamber.

BACKGROUND

Physical vapor deposition (PVD) in semiconductor fabrication is typically performed with a target made of a desired film material. In the case of alloys, the targets are typically composed of the alloy to be sputtered. In the case of new non-volatile memories, alloys of different compositions are used. As such, multiple targets in a multi-cathode (e.g., multi-target) PVD chamber have been utilized to sequentially deposit the different materials. However, because of the cross-contamination of the multiple targets, the targets are cleaned periodically to maintain film consistency. For example, one or more of the multiple targets may be covered by shutters during the cleaning process, which may lead to particle generation.

Therefore, the inventors have provided embodiments of process kits for a multi-cathode processing chamber.

SUMMARY

Embodiments of a process kit for use in a multi-cathode processing chamber are provided herein. In some embodiments, a process kit includes a rotatable shield having a base, a conical portion extend downward and radially outward from the base, and a collar portion extending radially outward from a bottom of the conical portion, wherein an egg-shaped hole is formed through the conical portion; an inner deposition ring having a leg portion, a flat portion extending radially inward from the leg portion, a first recessed portion extending radially inward from the flat portion, and a first lip extending upward from an innermost section of the first recessed portion; and an outer deposition ring having a collar portion, an upper flat portion disposed above and extending radially inward from the collar portion, a second recessed portion extending inward from the upper flat portion, and a second lip extending upward from an innermost section of the second recessed portion.

In some embodiments, a multi-cathode processing chamber includes a substrate support to support a substrate; a plurality of cathodes coupled to a carrier and having a corresponding plurality of targets to be sputtered onto the substrate; and a process kit disposed within the process chamber. The process kit includes a rotatable shield rotatably disposed between the substrate support and the plurality of targets, wherein the shield includes a base, a conical portion extend downward and radially outward from the base, and a collar portion extending radially outward from a bottom of the conical portion, wherein the shield includes an egg-shaped hole formed through the conical portion to expose one of the plurality of targets while covering the remainder of the plurality of targets; an inner deposition ring configured to be disposed atop the substrate support and beneath an outer edge of the substrate, wherein the inner deposition ring includes having a leg portion, a flat portion extending radially inward from the leg portion, a first recessed portion extending radially inward from the flat portion, and a first lip extending upward from an innermost section of the first recessed portion; and an outer deposition ring disposed radially outward of the inner deposition ring and having a collar portion, an upper flat portion disposed above and extending radially inward from the collar portion, a second recessed portion extending inward from the upper flat portion, and a second lip extending upward from an innermost section of the second recessed portion, wherein the leg portion of the inner deposition ring extends into the second recessed portion of the outer deposition ring to form a tortuous path between the inner and outer deposition rings.

In some embodiments, a process kit for use in a multi-cathode processing chamber includes a rotatable shield having a base, a conical portion extend downward and radially outward from the base, and a collar portion extending radially outward from a bottom of the conical portion, wherein an egg-shaped hole is formed through the conical portion; an inner deposition ring having a leg portion, a flat portion extending radially inward from the leg portion, a first recessed portion extending radially inward from the flat portion, and a first lip extending upward from an innermost section of the first recessed portion; an outer deposition ring having a collar portion, an upper flat portion disposed above and extending radially inward from the collar portion, a second recessed portion extending inward from the upper flat portion, and a second lip extending upward from an innermost section of the second recessed portion; a plurality of shrouds configured to be disposed about a corresponding plurality of targets between the plurality of targets and the rotatable shield; a conical shield, wherein a top section of the conical shield is configured to surround a lower portion of the rotatable shield, and wherein a bottom section of the conical shield is configured to surround a substrate support; and a cover ring configured to rest on the bottom section of the conical shield.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
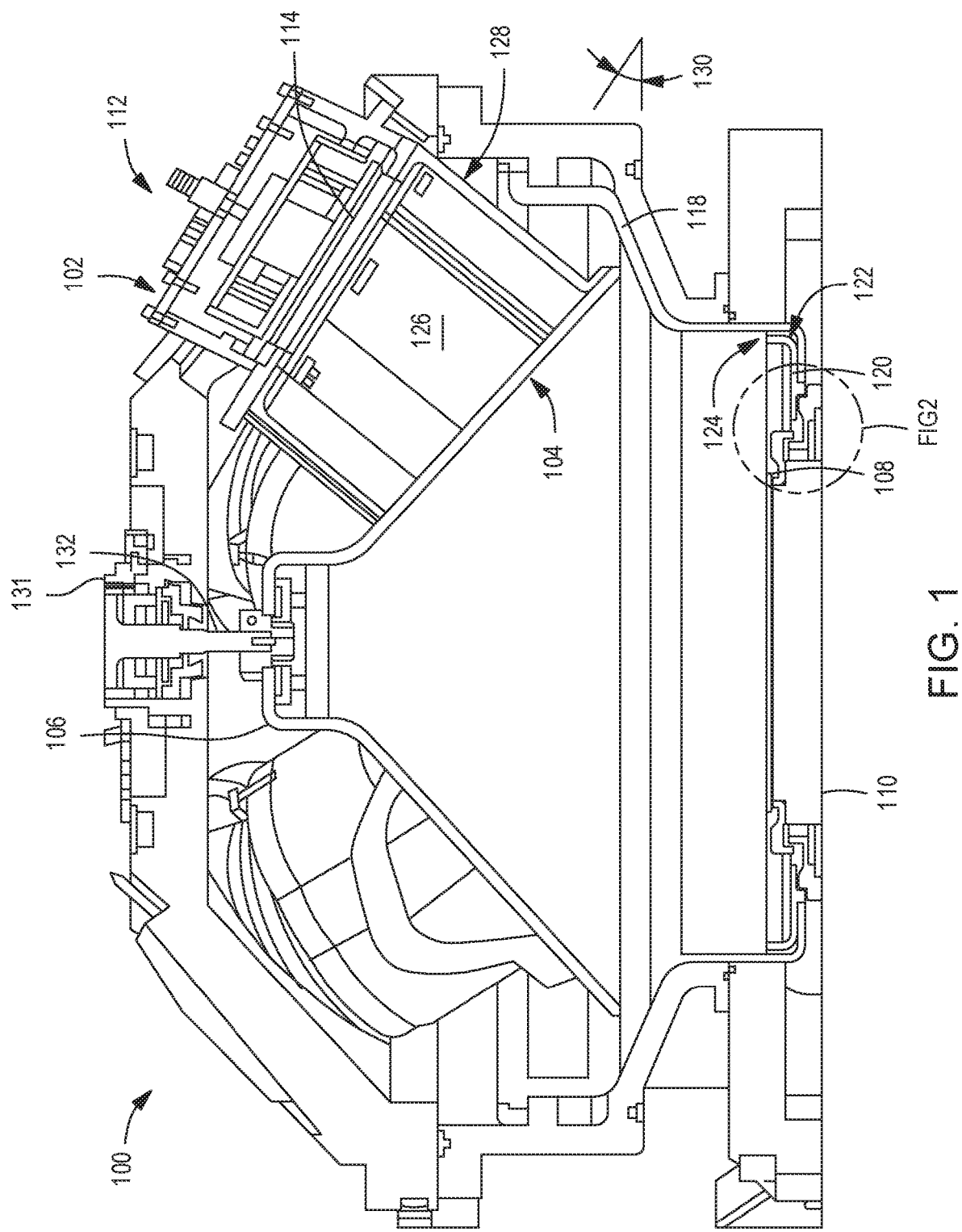
FIG. 1 depicts a cross-sectional view of a multi-cathode processing chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a process kit for use in a multi-cathode processing chamber are provided herein. The disclosed process kit may advantageously minimize or eliminate cross-contamination between targets. In addition, the disclosed process kit minimizes in the deposition of material on chamber components outside of the processing volume.

In some embodiments, a multi cathode-PVD chamber includes a plurality of cathodes, or targets, (for example, 5 cathodes) attached to a top adapter. Each cathode can have a DC/Pulse DC or RF target and an associated magnetron. Each cathode also has a shroud which is long tube which does not block a line of sight from the target to wafer. A common rotatable shield is provided in the center of the chamber that is shared by all the cathodes. Depending on the number of targets that need to be sputtered at the same time, the rotatable shield can have one or more holes, such as 1, 2, or 3 holes. The shroud surrounding each target advantageously captures a majority of the target flux that is not directed towards the wafer and hence likely to land on the wafer, thus significantly minimizing target cross-contamination. In some embodiments, the shroud material and surface treatment can be tailored to a specific target material being sputtered, thus improving defect performance.

FIG. 1 depicts a schematic cross-sectional view of a multi-cathode processing chamber (process chamber 100) in accordance with some embodiments of the present disclosure. The process chamber 100 includes a plurality of cathodes 102 (e.g., five cathodes) coupled to an upper portion of the process chamber 100 having a process kit 150 and a substrate support 110 disposed within the process chamber 100 below the plurality of cathodes 102. In some embodiments, the substrate support 110 may be a rotating pedestal. In some embodiments, the substrate support 110 may be vertically movable.

The plurality of cathodes 102 can be used for sputtering different materials on a substrate 108. In some embodiments, the substrate 108 is a structure having a semiconductor material used for fabrication of integrated circuits. For example, the substrate 108 can represent a semiconductor structure including a wafer.

In some embodiments, the process kit 150 includes a rotatable shield 106 to selectively cover one or more of the plurality of cathodes 102. The cathodes 102 are each exposed through an opening or hole 104 of the rotatable shield 106, which is disposed over the substrate 108 on the substrate support 110. Materials from the cathodes 102 can be deposited onto the substrate 108 through the hole 104.

A power supply 112 may be coupled to each of the plurality of cathodes 102. The power supply 112 may include direct current (DC), pulsed DC, or radio frequency (RF) power. The rotatable shield 106 may expose two or more of the plurality of cathodes 102 and shield remaining cathodes 102 from cross-contamination during sputtering. The cross-contamination results from physical movement or transfer of a deposition material from one of the cathodes 102 to another one of the cathodes 102. Each cathode 102 is positioned over a corresponding target 114. To sputter the selected target, the rotatable shield 106 is rotated to expose the selected target to be sputtered. The targets 114 may be formed of any material desired to be sputtered onto the substrate 108. A motor 131 is coupled to the rotatable shield 106 via a shaft 132 to facilitate the rotation of the rotatable shield 106.

In some embodiments, the process kit 150 further includes a shroud 126, which is a long tube that does not block a line of sight from the target 114 to a substrate disposed on the substrate support 110, corresponding to each cathode 102. Each shroud 126 includes a shroud rotation 128 to provide the cathodes 102 at an angle 130 of about 20 to 90 degrees. Different values of the angle 130 provide different uniformity profiles on a surface of the substrate. The angle 130 is measured between a plane of one of the targets 114 and a plane of the substrate support 110. In some embodiments, the angle 130 is about 30 degrees. In some embodiments, the angle 130 is alternatively about 40 degrees. Each shroud is configured to capture a majority of the target flux that is not directed towards and hence likely to land on substrate. As such, the shrouds significantly minimize target cross contamination. Additionally, the shroud material and surface treatment of the shroud may be tailored to specific target materials, thus improving defect performance.

In some embodiments, the process kit 150 further includes a conical shield 118, a cover ring 120, an inner deposition ring 140, and an outer deposition ring 142. As depicted in FIG. 1, a top section of the conical shield 118 is configured to surround a lower portion of the rotatable shield 106 and a bottom section of the conical shield 118 is configured to surround the substrate support 110. Before the substrate 108 moves into or out of the chamber, the substrate 108 can move below a conical shield 118 disposed on a lower portion of the process chamber. A cover ring 120 is disposed on top of the conical shield 118 and surrounds the substrate 108. When the substrate support 110 moves down, the substrate 108 can be lifted up with a robotic arm (not shown) before the substrate 108 moves out of the chamber.

The cover ring 120 can include a ring portion 122 that curves up and has a predefined thickness to form a dish or bowl in which the substrate can be disposed with the ring portion 122 surrounding and disposed above the substrate 108. The cover ring 120 can also include a predefined gap 124 and a predefined length with respect to the conical shield 118. Thus, when materials are deposited on the substrate 108, the materials are prevented or substantially prevented from depositing below the substrate support 110 or outside of the conical shield 118. Controlling the deposition of materials as described advantageously prevents or reduces the spread of contaminants to the substrate 108 or within the process chamber.

The inner and outer deposition rings 140, 142 further prevent deposition of the material below the substrate support 110. The inventors have discovered that a two-piece deposition ring advantageously reduces wear caused by a stationary deposition ring that can contact the rotating substrate 108 and/or substrate support 110 causing damage and generating particles that can contaminate the chamber. As such, the inventors have provided the inner deposition ring 140, which sits on and rotates with the substrate support 110, and an outer deposition ring 142, which sits on a stationary chamber component.

Figure 2:
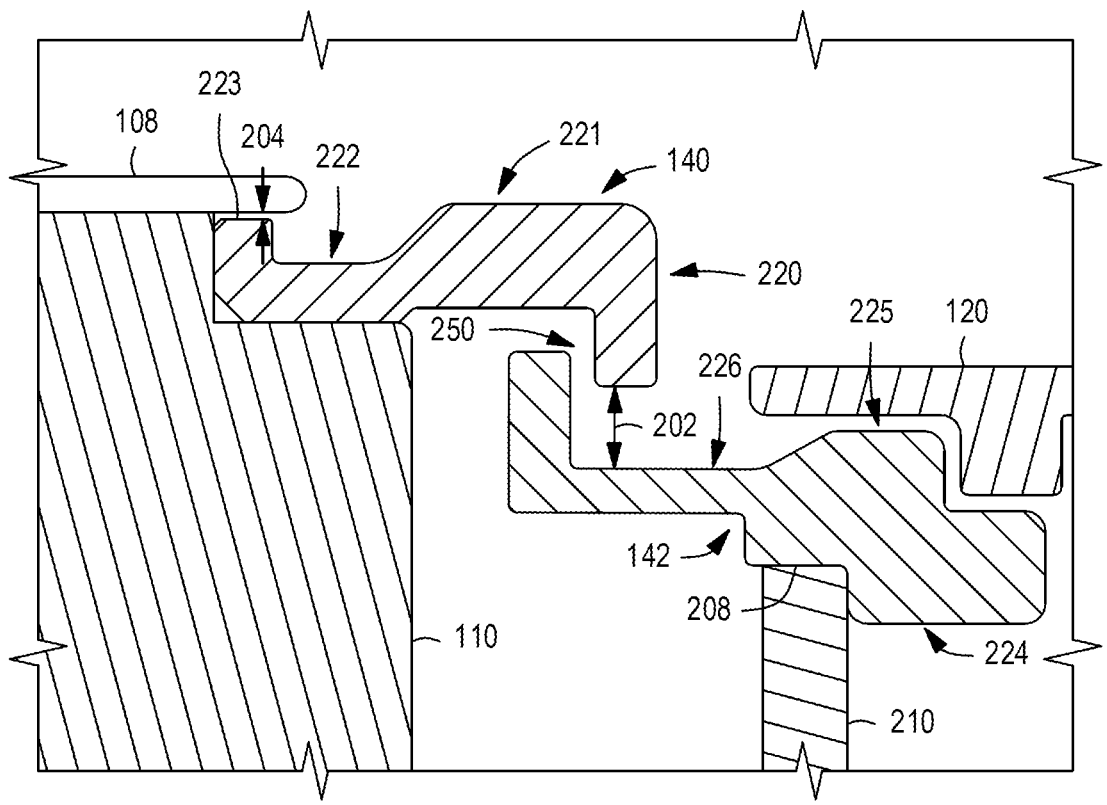
FIG. 2 depicts a zoomed cross-sectional view of a deposition ring of the multi-cathode processing chamber of FIG. 1.

FIG. 2 depicts a zoomed in cross-sectional view of the section depicted in FIG. 1. In some embodiments, the inner deposition ring 140 includes a leg portion 220, a flat portion 221 extending radially inward from the leg portion 220, a first recessed portion 222 extending radially inward from the flat portion 221, and a first lip 223 extending upward from an innermost section of the first recessed portion 222. In some embodiments, the outer deposition ring 142 includes a collar portion 224, an upper flat portion 225 disposed above and extending radially inward from the collar portion 224, a second recessed portion 226 extending inward from the upper flat portion 225, and a second lip 227 extending upward from an innermost section of the second recessed portion 226. In some embodiments, the inner deposition ring 140 may also include a ledge 206 at the outer periphery of the first recessed portion 222 to prevent the substrate 108 from falling off the substrate support 110 in case the substrate 108 moves during rotation of the substrate support 110.

As illustrated in FIG. 2, the leg portion 220 of the inner deposition ring 140 extends into the second recessed portion 226 of the outer deposition ring 142 to form a tortuous path 250 between the inner and outer deposition rings 140, 142. In some embodiments, the leg portion 220 of the inner deposition ring 140 is vertically spaced apart from the second recessed portion 226 of the outer deposition ring 142 by a first gap 202 to ensure the rotating inner deposition ring 140 does not contact the stationary outer deposition ring 142 while also ensuring that sputtered material does not escape into an area beneath the substrate support 110. In some embodiments, the first gap 202 is between about 0.045 inches and about 0.055 inches. The first lip 223 is vertically spaced apart from the substrate 108 by a second gap 204 to ensure the inner deposition ring 140 does not contact and contaminate the substrate 108. In some embodiments, the second gap 204 is between 0.008 inches and about 0.012 inches. In some embodiments, the inner deposition ring 140 has a first inner diameter of about 11.5 inches and a first outer diameter of about 12.8 inches. In some embodiments, the outer deposition ring 142 has a second inner diameter of about 12.2 inches and a second outer diameter between about 13.7 inches and about 14.6 inches.

Figure 3:
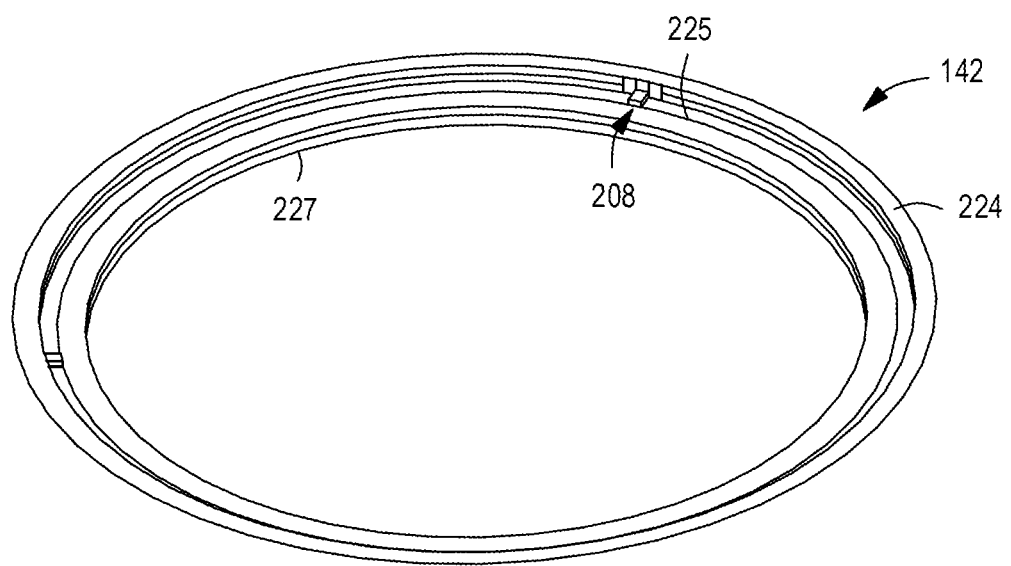
FIG. 3 depicts a perspective bottom view of a deposition ring in accordance with some embodiments of the present disclosure.

In some embodiments, the outer deposition ring 142 includes a plurality of features 208 that rest on a component 210 of the substrate support when the outer deposition ring 142 is installed in the process chamber 100. FIG. 3 is a perspective bottom view of the deposition ring 142 illustrating more clearly the plurality of features 208. As illustrated in FIG. 3, the plurality of features 208 protrude from a bottom surface of the upper flat portion 225.

Figure 4:
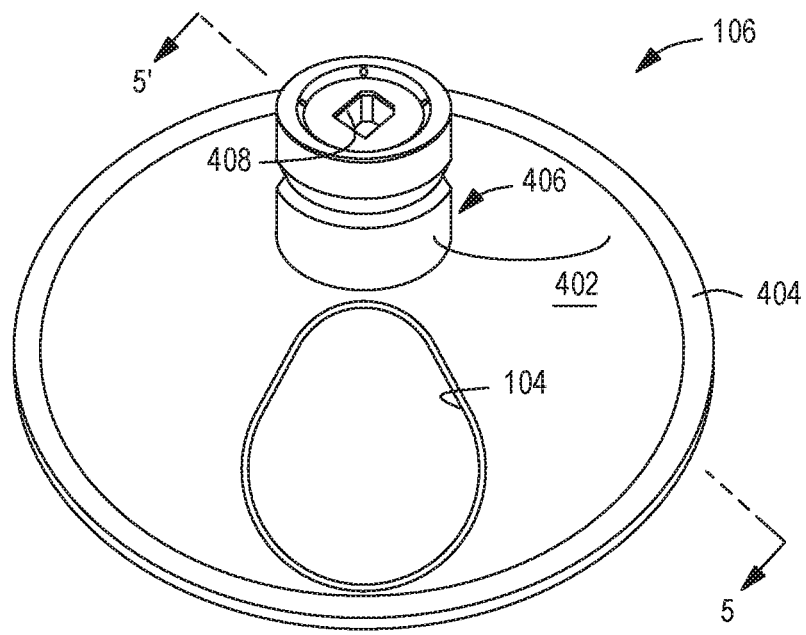
FIG. 4 depicts a perspective top view of a rotatable shield in accordance with some embodiments of the present disclosure.
Figure 5:
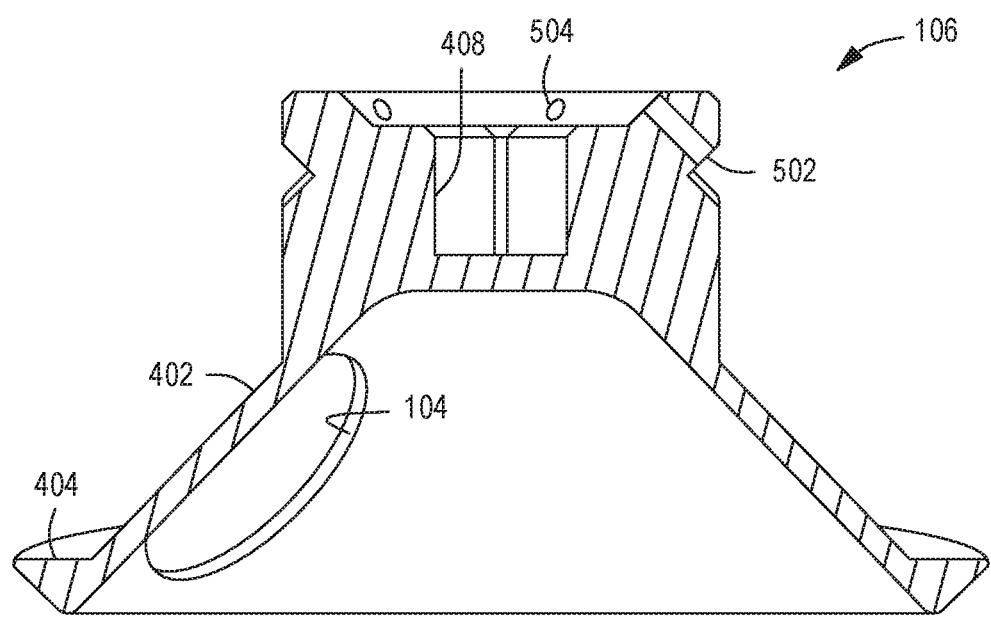
FIG. 5 depicts a cross-section view of the rotatable shield of FIG. 4 taken along line 5-5'.

The following description of the rotatable shield 106 will be made with referenced to FIGS. 4 and 5. FIG. 4 depicts a perspective top view of the rotatable shield 106 in accordance with some embodiments of the present disclosure. FIG. 5 depicts a cross-sectional view of the rotatable shield 106 of FIG. 4 taken along line 5-5'. In some embodiments, the rotatable shield includes a base 406, a conical portion 402 extending downward and radially outward from the base 406, and a collar portion 404 extending radially outward from the bottom of the conical portion 402. The hole 104 is formed in the conical portion 402. A mating hole 408 is formed in the upper surface of the base 406 to receive the shaft 132 to facilitate the rotation of the rotatable shield 106. The mating hole 408 has a shape corresponding to the shaft 132 and is configured to impart rotation from the shaft 132 to the rotatable shield 106, while eliminating the possibility of the shaft 132 rotating relative to the rotatable shield 106. That is, the mating hole 108 is shaped to prevent the shaft 132 from slipping within the mating hole 108 and rotating relative to the rotatable shield 106.

As illustrated in FIG. 5, the base includes a plurality of holes 504 through which fixation elements extend to fix the rotatable shield 106 to the shaft 132. In some embodiments, the base 406 may further include a v-shaped channel 502 to provide an easily manufactured, secure mounting face for the fixation elements. In some embodiments, the hole 104 is egg-shaped to correspond to a shape of the shroud 126.

While the foregoing is directed to embodiments of the present disclosure, other and further embodiments of the disclosure may be devised without departing from the basic scope thereof.

The invention claimed is:

1. A process kit for use in a multi-cathode processing chamber, comprising:
    a rotatable shield having a base, a conical portion extend downward and radially outward from the base, and a collar portion extending radially outward from a bottom of the conical portion, wherein an egg-shaped hole is formed through the conical portion;
    an inner deposition ring having a leg portion, a flat portion extending radially inward from the leg portion, a first recessed portion extending radially inward from the flat portion, and a first lip extending upward from an innermost section of the first recessed portion;
    an outer deposition ring having a collar portion, an upper flat portion disposed above and extending radially inward from the collar portion, a second recessed portion extending downward and radially inward from the upper flat portion, and a second lip extending upward from an innermost section of the second recessed portion, wherein the outer deposition ring has an outermost diameter greater than an outermost diameter of the inner deposition ring, wherein the leg portion of the inner deposition ring is configured to fit within the second recessed portion of the outer deposition ring; and
    a cover ring configured to surround the inner deposition ring, wherein an outermost diameter of the cover ring is greater than the outermost diameter of the inner deposition ring, and wherein an outer peripheral portion of the cover ring includes a ring portion that curves up to form a bowl.

2. The process kit of claim 1, wherein the outer deposition ring includes a plurality of features, where each feature comprises a protrusion that protrudes from a bottom surface of the upper flat portion and are configured to rest on an underlying chamber component.

3. The process kit of claim 1, wherein a tortuous path between the inner deposition ring and the outer deposition ring extends between an upper surface of the second lip of the outer deposition ring and a lower surface of the flat portion of the inner deposition ring.

4. The process kit of claim 1, wherein at least one of:
    a second inner diameter of the outer deposition ring is about 12.2 inches or
    a second outer diameter of the outer deposition ring is between about 13.7 inches and 14.6 inches.

5. The process kit of claim 1, wherein the second lip of the outer deposition ring is raised with respect to the upper flat portion of the outer deposition ring.

6. The process kit of claim 1, further comprising:
    a plurality of shrouds configured to be disposed about a corresponding plurality of targets between the plurality of targets and the rotatable shield.

7. The process kit of claim 1, further comprising:
    a conical shield, wherein a top section of the conical shield is configured to surround a lower portion of the rotatable shield, and wherein a bottom section of the conical shield is configured to surround a substrate support.

8. The process kit of claim 7,
    wherein the cover ring is configured to rest on the bottom section of the conical shield.

9. A multi-cathode processing chamber, comprising:
    a substrate support to support a substrate;
    a plurality of cathodes coupled to a carrier and having a corresponding plurality of targets to be sputtered onto the substrate; and a process kit disposed within the multi-cathode processing chamber, wherein the process kit comprises:
a rotatable shield rotatably disposed between the substrate support and the plurality of targets, wherein the rotatable shield includes a base, a conical portion extend downward and radially outward from the base, and a collar portion extending radially outward from a bottom of the conical portion, wherein an egg-shaped hole is formed through the conical portion to expose one of the plurality of targets while covering a remainder of the plurality of targets;
an inner deposition ring configured to be disposed atop the substrate support and beneath an outer edge of the substrate, wherein the inner deposition ring includes a leg portion, a flat portion extending radially inward from the leg portion, a first recessed portion extending radially inward from the flat portion, and a first lip extending upward from an innermost section of the first recessed portion; and
an outer deposition ring disposed radially outward of the inner deposition ring and having a collar portion, an upper flat portion disposed above and extending radially inward from the collar portion, a second recessed portion extending downward and radially inward from the upper flat portion, and a second lip extending upward from an innermost section of the second recessed portion,
wherein the leg portion of the inner deposition ring extends into the second recessed portion of the outer deposition ring to form a tortuous path between the inner and outer deposition rings, and wherein the outer deposition ring has an outermost diameter greater than an outermost diameter of the inner deposition ring; and a cover ring configured to surround the inner deposition ring, wherein an outermost diameter of the cover ring is greater than the outermost diameter of the inner deposition ring, and wherein an outer peripheral portion of the cover ring includes a ring portion that curves up to form a bowl.

10. The multi-cathode processing chamber of claim 9, wherein the leg portion of the inner deposition ring is vertically spaced apart from the second recessed portion of the outer deposition ring by a first gap between about 0.045 inches and about 0.055 inches.

11. The multi-cathode processing chamber of claim 9, wherein the first lip of the inner deposition ring is vertically spaced apart from the substrate by a second gap between about 0.008 inches and about 0.012 inches.

12. The multi-cathode processing chamber of claim 9, wherein the plurality of cathodes includes five cathodes.

13. The multi-cathode processing chamber of claim 9, further comprising:
a plurality of shrouds each surrounding a corresponding one of the plurality of targets.

14. The multi-cathode processing chamber of claim 9, wherein the process kit further comprises:
a conical shield, wherein a top section of the conical shield surrounds a lower portion of the rotatable shield, and wherein a bottom section of the conical shield surrounds the substrate support.

15. The multi-cathode processing chamber of claim 14, wherein the process kit further comprises:
the cover ring disposed atop the bottom section of the conical shield.

16. The multi-cathode processing chamber of claim 9, wherein a first inner diameter of the inner deposition ring is about 11.5 inches.

17. The multi-cathode processing chamber of claim 9, wherein a first outer diameter of the inner deposition ring is about 12.8 inches.

18. The multi-cathode processing chamber of claim 9, wherein a second inner diameter of the outer deposition ring is about 12.2 inches.

19. The multi-cathode processing chamber of claim 9, wherein a second outer diameter of the outer deposition ring is between about 13.7 inches and about 14.6 inches.

20. A process kit for use in a multi-cathode processing chamber, comprising:
a rotatable shield having a base, a conical portion extend downward and radially outward from the base, and a collar portion extending radially outward from a bottom of the conical portion, wherein an egg-shaped hole is formed through the conical portion;
an inner deposition ring having a leg portion, a flat portion extending radially inward from the leg portion, a first recessed portion extending radially inward from the flat portion, and a first lip extending upward from an innermost section of the first recessed portion;
an outer deposition ring having a collar portion, an upper flat portion disposed above and extending radially inward from the collar portion, a second recessed portion extending downward and radially inward from the upper flat portion, and a second lip extending upward from an innermost section of the second recessed portion, wherein the inner deposition ring and the outer deposition ring form a tortuous path therebetween, wherein the inner deposition ring is configured to rotate with a substrate support while the outer deposition ring is stationary, wherein the outer deposition ring has an outermost diameter greater than an outermost diameter of the inner deposition ring, wherein the leg portion of the inner deposition ring is configured to fit within the second recessed portion of the outer deposition ring, and wherein a gap is disposed between the inner deposition ring and the outer deposition ring to ensure that the inner deposition ring does not contact the outer deposition ring;
a plurality of shrouds configured to be disposed about a corresponding plurality of targets between the plurality of targets and the rotatable shield;
a conical shield, wherein a top section of the conical shield is configured to surround a lower portion of the rotatable shield, and wherein a bottom section of the conical shield is configured to surround the substrate support; and
a cover ring configured to rest on the bottom section of the conical shield, wherein an outermost diameter of the cover ring is greater than the outermost diameter of the inner deposition ring, and wherein an outer peripheral portion of the cover ring includes a ring portion that curves up to form a bowl.

\* \* \* \* \*